United States Patent
Lee

(10) Patent No.: US 10,446,625 B2
(45) Date of Patent: Oct. 15, 2019

(54) ORGANIC LIGHT EMITTING DIODE DISPLAY DEVICE

(71) Applicant: LG Display Co., Ltd., Seoul (KR)

(72) Inventor: Jiheun Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 71 days.

(21) Appl. No.: 15/695,326

(22) Filed: Sep. 5, 2017

(65) Prior Publication Data

US 2018/0083077 A1 Mar. 22, 2018

(30) Foreign Application Priority Data

Sep. 22, 2016 (KR) .................. 10-2016-0121657

(51) Int. Cl.
*H01L 27/32* (2006.01)
*H01L 51/00* (2006.01)

(52) U.S. Cl.
CPC ...... *H01L 27/3246* (2013.01); *H01L 51/0005* (2013.01)

(58) Field of Classification Search
None
See application file for complete search history.

(56) References Cited

U.S. PATENT DOCUMENTS

| 2009/0026467 A1* | 1/2009 | Yanagihara | H01L 27/3246 257/88 |
| 2009/0160322 A1* | 6/2009 | Yoshida | H01L 27/3246 313/504 |
| 2014/0139102 A1* | 5/2014 | Jeon | H01L 27/3246 313/504 |
| 2014/0197396 A1* | 7/2014 | Madigan | H01L 51/0005 257/40 |

* cited by examiner

*Primary Examiner* — Bilkis Jahan
*Assistant Examiner* — Victor V Barzykin
(74) *Attorney, Agent, or Firm* — Morgan, Lewis & Bockius LLP

(57) ABSTRACT

An organic light emitting diode display device includes a substrate having pixel areas which are defined in a matrix form in first and second directions intersecting each other; a plurality of first electrodes each arranged in the corresponding pixel areas; a first bank having at least one first opening through which at least part of the first electrode is exposed; a second bank covering a part of the first bank and having at least one second opening through which at least part of the first electrode is exposed; and an organic emission layer disposed in the first opening. The second opening extends in the first direction so that the plurality of first electrodes arranged in the first direction is exposed through the second opening.

20 Claims, 14 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

ORGANIC LIGHT EMITTING DIODE DISPLAY DEVICE

BACKGROUND

Technical Field

The present invention relates to an organic light emitting diode display device, and more particularly, to an organic light emitting diode display device having a two-stage bank structure.

Discussion of the Related Art

Various display devices have been recently developed to address the weight and volume issues of a cathode ray tube. Such display devices include Liquid Crystal Display (LCD), Plasma Display Panel (PDP), Field Emission Display (FED), and organic light emitting diode display device.

The organic light emitting diode display device is a self light-emitting device which is capable of emitting light by itself, and has advantages of a fast response time, a high light emitting efficiency, high luminance, and a wide viewing angle. In addition, it can be formed on a flexible substrate, such as plastics, so a flexible display device can be realized.

Recently, there are demands for a large-sized and high-resolution organic light emitting diode display device. To make such a display device, a plurality of pixels are included in a single panel. Generally, a mask is used for patterning red (R), green (G), and blue (B) pixels, and a corresponding large-sized Fine Metal Mask (FMM) is needed to provide a large-sized display device. However, the mask may sag due to the large size, and this may lead to many errors and problems including organic emission layers which are not deposited in place.

In order to address the aforementioned problem of a deposition technique using a mask, a solution process which is simple and advantageous for large area patterning is drawing attentions. The solution process enables large area patterning with inkjet printing or nozzle printing, without a mask, and boasts with a material reuse rate of 50 to 80% which is higher than 10% or less material reuse rate of a vacuum deposition technique. In addition, a final result from the solution process may have a glass transition temperature higher than a vacuum deposited thin film, thereby exhibiting excellent thermal stability and morphology.

However, if an organic emission layer is formed with the solution process, it may result in a pile-up phenomenon and this may degrade luminous properties of the organic light emitting diode display device. More specifically, referring to FIG. 1, organic emission materials 1 is coated on a first electrode 4 partitioned by a bank 3 using an inkjet device 2. The coated organic emission materials 1 have a thickness deviation at each location due to difference in a hardening rate. That is, an organic emission layer 7 is formed non-uniform such that an edge portion 5 in contact with the bank is thick, while a central portion 6 is thin.

As such, if the non-uniform organic emission layer 7 is formed, it may result in a luminance deviation at each location image displaying quality may be degraded. In addition, it may result in difference in current density inside the organic emission layer 7, and therefore, a lifespan of the device may be reduced or a dark spot may occur, thereby reducing a process yield. Considering the above, it is necessary to reduce an area of a pile-up phenomenon as much as possible when forming a organic emission layer with the solution process.

SUMMARY

Accordingly, embodiments of the present disclosure are directed to an organic light emitting diode display device that substantially obviates one or more of the problems due to limitations and disadvantages of the related art.

An aspect of the present disclosure is to provide an organic light emitting diode display device having a two-stage bank structure.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting diode display device comprises a substrate having pixel areas which are defined in a matrix form in first and second directions intersecting each other; a plurality of first electrodes each arranged in the corresponding pixel areas; a first bank having at least one first opening through which at least part of the first electrode is exposed; a second bank covering a part of the first bank and having at least one second opening through which at least part of the first electrode is exposed; and an organic emission layer disposed in the first opening. The second opening extends in the first direction so that the plurality of first electrodes arranged in the first direction is exposed through the second opening.

In another aspect, an organic light emitting diode display device having a plurality of pixels which are arranged in a matrix form in first and second directions intersecting each other comprises a first bank patterned in units of one pixel to define an emission area in each of the plurality of pixels; and a second bank disposed on the first bank and extending in a first direction between neighboring pixels in a second direction to be arranged in a stripe pattern.

In another aspect, an organic light emitting diode display device having a plurality of pixels which are arranged in a matrix form in first and second directions intersecting each other comprises a first bank extending in a second direction between neighboring pixels in a first direction be arranged in a stripe pattern; and a second bank is disposed on the first bank and extends in the first direction between neighboring pixels in the second direction to be arranged in a stripe pattern, wherein the first bank and the second bank intersect from each other to define an emission area in each of the plurality of pixels.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In addition, terms of constituent elements in the following description may be selected in consideration of ease of the preparation of the specification, and the terms may be different from actual name of the corresponding elements. In the description of various embodiments, the same elements may be described with reference to the first embodiment and omitted from the description of other embodiments.

First Embodiment

Figure 1:
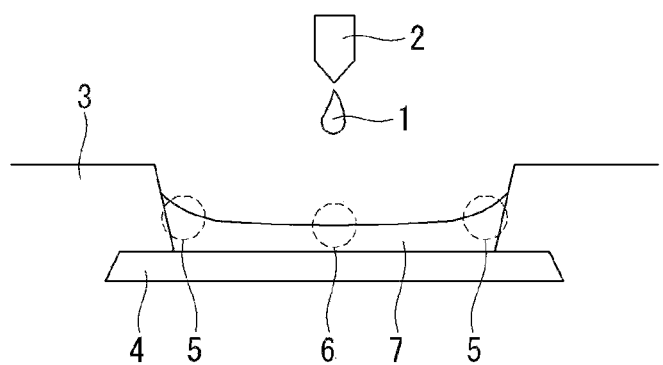
FIG. 1 is a diagram for explanation of a problem of the solution process.
Figure 2:
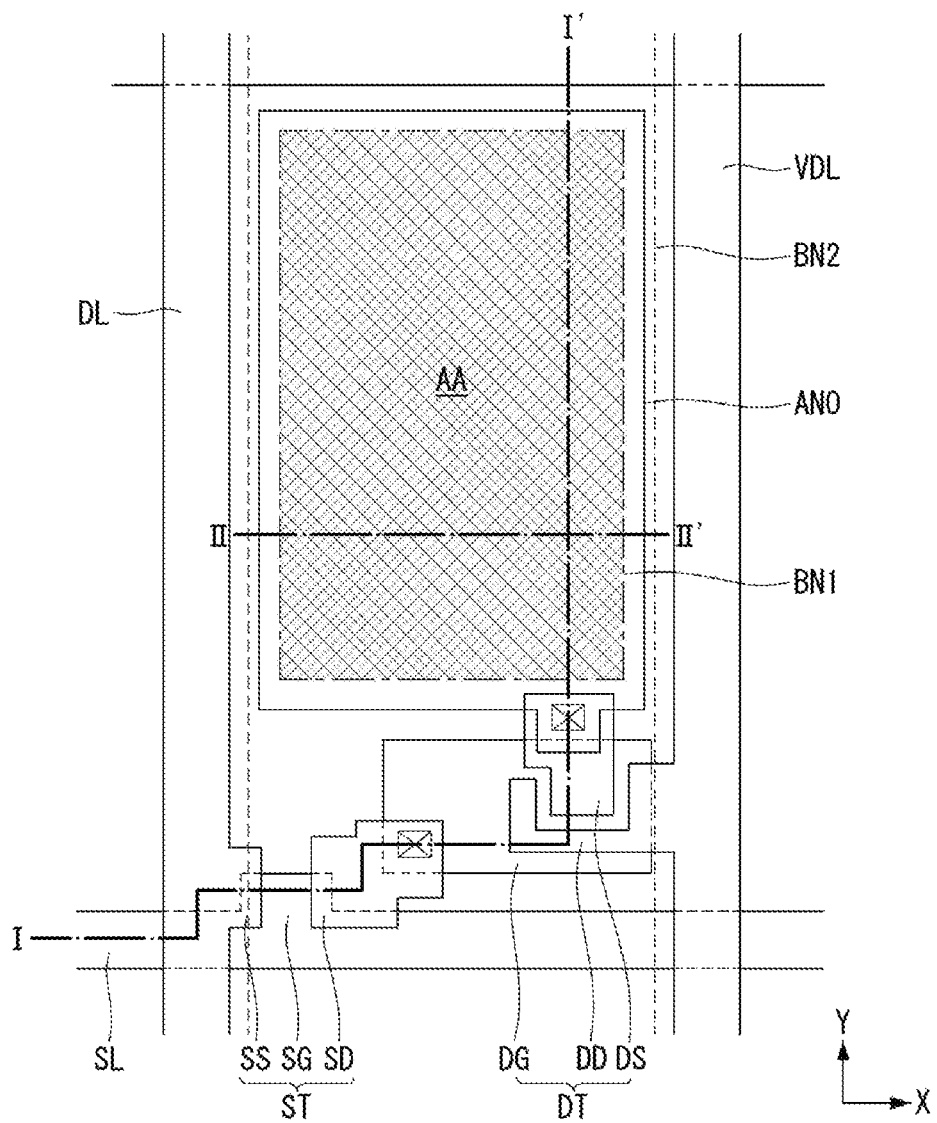
FIG. 2 is a plane view of an organic light emitting diode display device according to a first embodiment of the present invention.
Figure 3:
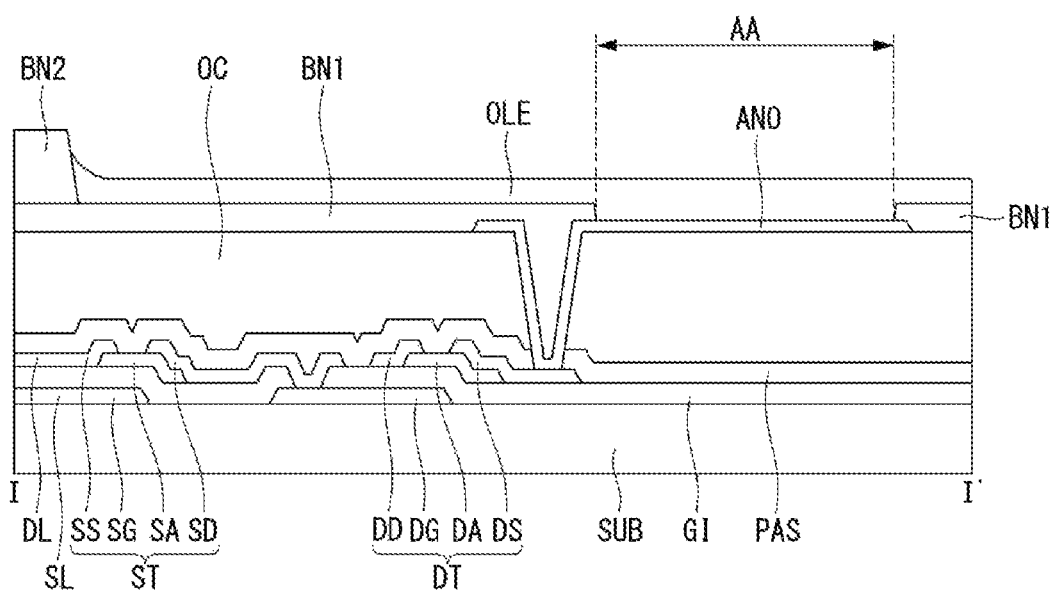
FIG. 3 is a cross-sectional view of FIG. 2 taken along line I-I'.
Figure 4:
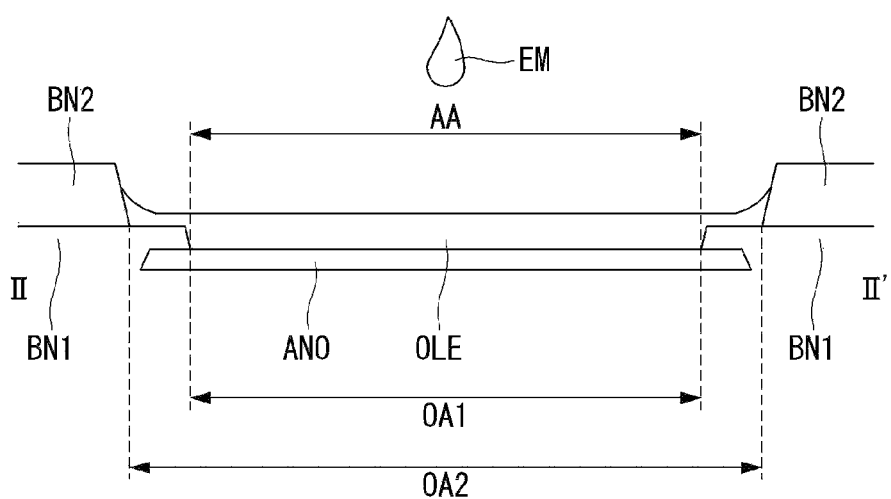
FIG. 4 is a cross-sectional view of FIG. 2 taken along line II-II'.

With reference to FIGS. 2 to 7, an organic light emitting diode display device according to a first embodiment of the present invention will be described. FIG. 2 is a plane view of the organic light emitting diode display device according to the first embodiment of the present invention. FIG. 3 is a cross-sectional view of FIG. 2 taken along line I-I'. FIG. 4 is a cross-sectional view of FIG. 2 taken along line II-II'.

Referring to FIGS. 2 to 4, the organic light emitting diode display device according to the first embodiment of the present invention may include a substrate having pixel areas which are defined in a matrix form in a first direction (for example, the Y-axis direction) and a second direction (for example, the X-axis direction). Each pixel area may be defined by a scan line SL, a data line DL, and a driving current line VDL. Each pixel area includes a Thin Film Transistor (TFT), and an organic light emitting diode which is electrically connected to the TFT. The organic light emitting diode includes a first electrode ANO, a second electrode opposing the first electrode ANO, and an organic emission layer OLE disposed between the first electrode ANO and the second electrode. The first electrode ANO may be an anode electrode, and the second electrode may be a cathode electrode.

The TFT may include a switching TFT ST, and a driving TFT DT connected to the switching TFT ST. The switching TFT ST is formed at an intersection of the scan line SL and the data line DL, and functions as selecting a pixel. The switching TFT ST includes a gate electrode SG branched from the scan line SL, a semiconductor layer SA, a source electrode SS, and a drain electrode SD. The driving TFT DT functions as driving an organic light emitting diode of a pixel which is selected by the switching TFT ST. The driving TFT DT includes a gate electrode DG connected to the drain electrode SD of the switching TFT ST, a semiconductor layer DA, a drain electrode DD branched from the driving current line VDL, and a source electrode DS. The source electrode DS of the driving TFT DT is connected to the first electrode ANO.

A first bank BN1 is formed to cover the switching TFT ST, the driving TFT DT, and various lines DL, SL, and VDL. The first bank BN1 includes a first opening OA1 through which at least part of the first electrode ANO is exposed. The first electrode ANO exposed through the first bank BN1 may be defined as an emission area AA.

For example, the first bank BN1 may be formed to cover the edge of the first electrode ANO, so that the center of the first electrode ANO is largely exposed. In this case, the boundary of the first opening OA1 may be situated inside the boundary of the first electrode ANO. The boundary of the first opening OA1 determines the plane shape of the first opening OA1. The boundary of the first electrode ANO determines the plane shape of the first electrode ANO.

A second bank BN2 is formed on the first bank BN1. The second bank BN2 covers a part of the first bank BN1, and include a second opening OA2 through which at least part of the first electrode ANO is exposed. The second opening OA2 extends in the first direction.

The second opening OA2 may be formed larger than the first opening OA1 so as to accommodate the first opening OA1. That is, the boundary of the second opening OA2 may be spaced apart at a predetermined distance outwardly from the boundary of the first opening OA1. The boundary of the second opening OA2 determine the plane shape of the second opening OA2.

More specifically, the gate electrodes SG and DG of the switching TFT ST and the driving TFT DT are formed on a substrate SUB of the organic light emitting diode display device. A gate insulating film GI is formed on the gate electrodes SG and DG. The semiconductor layers SA and DA partly overlapping the gate electrodes SG and DG are formed on the gate insulating film GI. A part of the semiconductor layers SA and DA overlapping the gate electrodes SG and DG may be defined as a channel area.

The source electrodes SS and DS and the drain electrodes SD and DD are formed on the semiconductor layers SA and DA, and spaced apart from each other, respectively. The source electrodes SS and DS come into contact with respective one end of the semiconductor layers SA and DA, and the drain electrodes SD and DD come into contact with the respective other end of the semiconductor layers SA and DA. The drain electrode SD of the switching TFT ST comes into contact with the gate electrode DG of the driving TFT DT through a contact hole that penetrates the gate insulating film GI. The structure of a TFT applied to a preferable embodiment of the present invention is not limited to the structure shown in the drawings, and it may include various structures such as a top gate structure, a bottom gate structure, and a double gate structure.

An insulating layer is formed on the gate insulating film GI and the TFTs ST and DT. The insulating layer may include one or more insulating films. For example, the insulating layer may include a first insulating film PAS and a second insulating film OC. The first insulating film PAS may include an inorganic insulating material, and the second insulating film OC may include an organic insulating material. Since including the organic insulating material, the second insulating film OC may function as a planarization layer. Hereinafter, an exemplary structure in which the first insulating film and the second insulating film are formed sequentially is described for convenience of explanation.

The first electrode ANO is formed on the second insulating film OC. The first electrode ANO is connected to the drain electrode DD of the driving TFT DT through a contact hole that penetrates the first insulating film PAS and the second insulating film OC.

The first bank BN1 is formed on the substrate SUB on which the first electrode ANO is formed. The first bank BN1 may be formed with a relatively thick thickness, so that an organic emission layer OLE which will be formed later can be disposed on both the first electrode ANO and the first bank BN1. The first bank BN1 may be formed of hydrophilic inorganic insulating materials such as silicon oxide (SiO2) or silicon-nitride (SiNx). The hydrophilic property of the first bank BN1 causes organic emission materials EM forming the organic emission layer OLE to spread well on the first bank BN1.

The first bank BN1 includes the first opening OA1 through which at least part of the first electrode ANO is exposed. The first bank BN1 may function as a defining layer that defines the emission area AA of the first electrode ANO.

The second bank BN2 is formed on the substrate SUB on which the first bank BN1 is formed. The second bank BN2 may be formed of hydrophobic organic insulating materials or organic materials containing hydrophobic materials. The hydrophobic property of the second bank BN2 causes organic emission materials EM, which form an organic emission layer OLE, to gather at the center. In addition, the second bank BN2 may function as a barrier that confines the organic emission materials EM coated on corresponding areas, so that the organic emission materials EM of different colors are prevented from being mixed together.

The second bank BN2 includes a second opening OA2 through which at least part of the first electrode ANO is exposed. The second opening OA2 is spaced apart at a predetermined distance outwardly from the boundary of the first opening OA1. Accordingly, a part of the first opening OA1 may be exposed through the second opening OA2.

An organic emission layers OLE is formed on the substrate SUB on which the second bank BN2 is formed. In the solution process, organic emission materials EM, which is used to form the organic emission layer OLE, are coated to cover at least a part of the first electrode ANO and a part of the first bank BN1. The first bank BN1 is a hydrophilic thin film provided to prevent poor wettability caused by the hydrophobic property of the first electrode ANO, and the first bank BN1 helps hydrophilic organic emission materials EM to spread out well. The second bank BN2 is a hydrophobic thick film that is able to push hydrophilic organic emission materials EM toward the center. Due to the combination of the first bank and the second bank, the organic emission layer OLE may be formed with a uniform thickness in the emission area AA.

The organic light emitting diode display device according to the first embodiment of the present invention is able to prevent degradation of uniformity of the organic emission layer OLE, thereby preventing degradation in display quality due to a thickness deviation at each location. In addition, as a uniform thickness of the organic emission layer OLE is secured, it is possible to prevent reduction in a lifespan of the device and occurrence of a dark spot.

Figure 5:
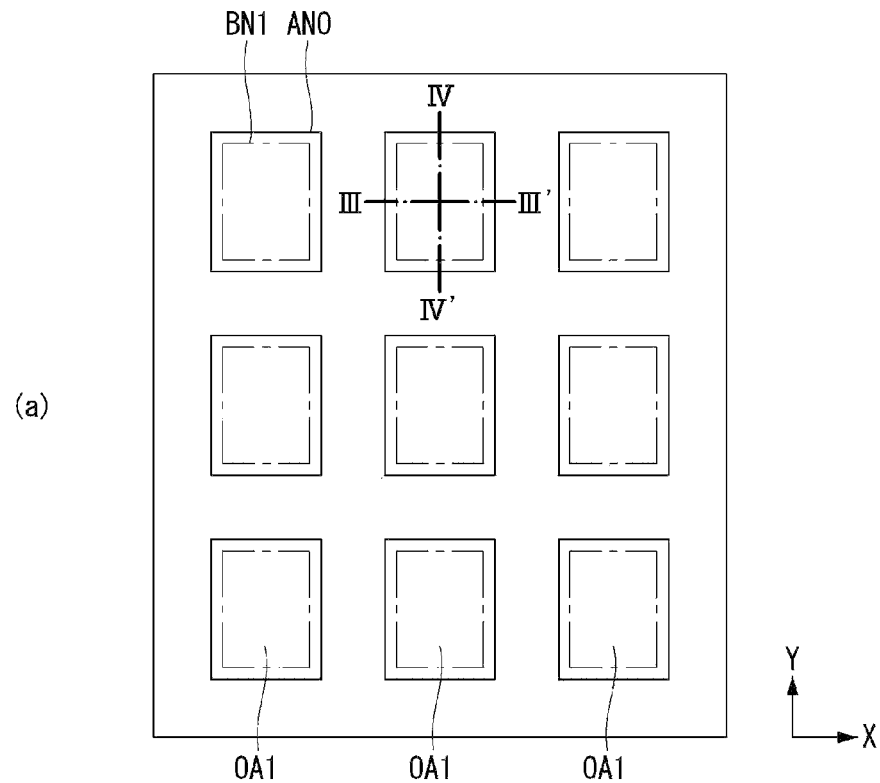
FIGS. 5 to 7 are time series diagrams showing how a first electrode, a first bank, a second bank, and an organic emission layer according to the first embodiment are formed.
Figure 5:
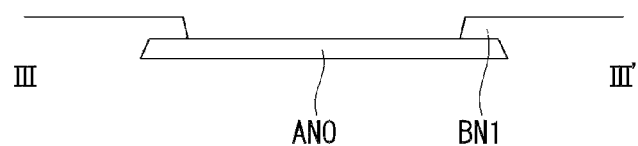
Figure 5:
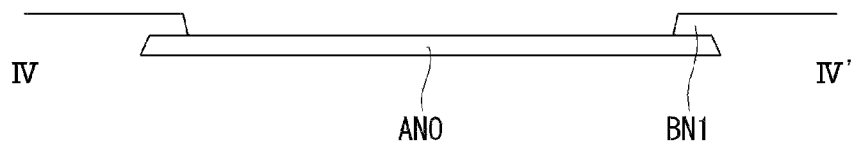
Figure 6:
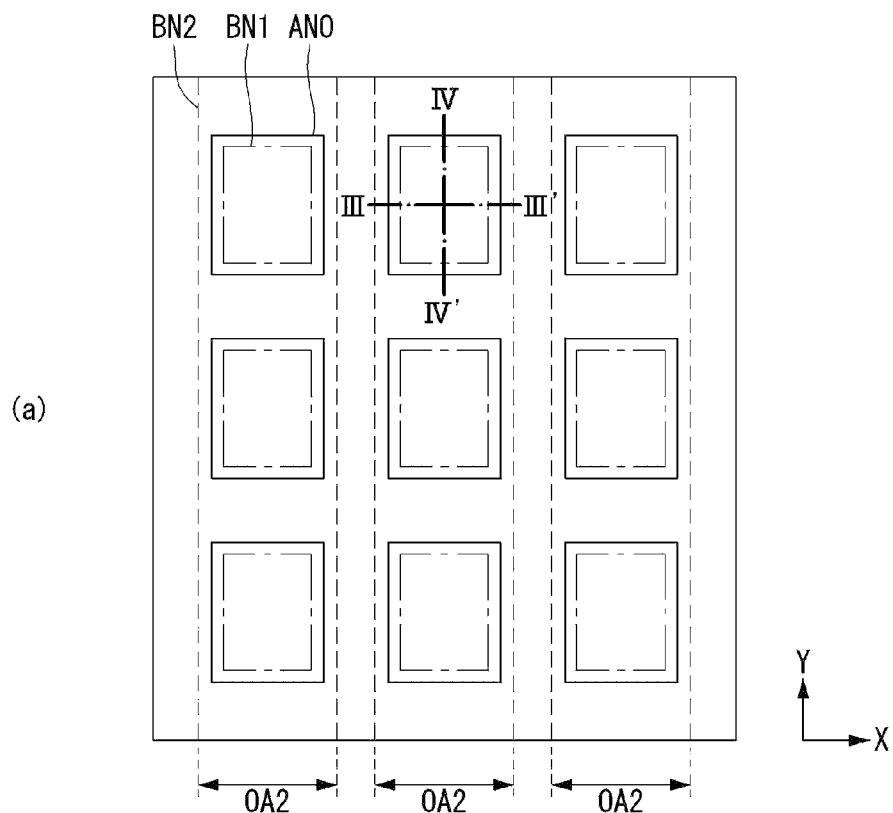
Figure 6:
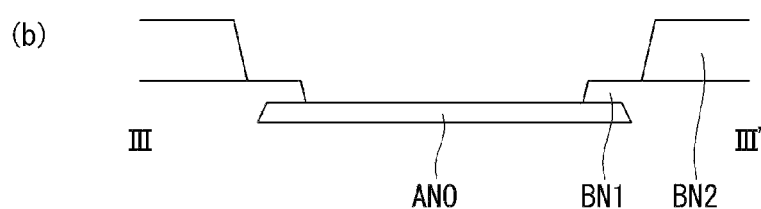
Figure 6:
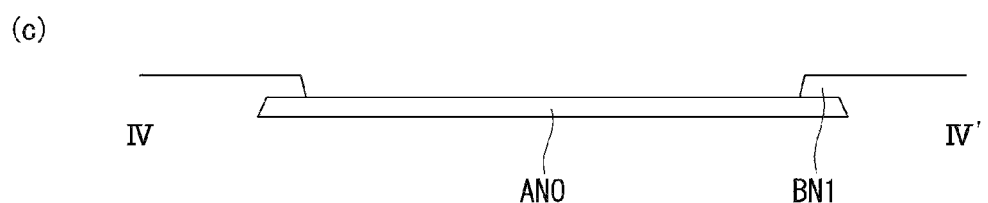
Figure 7:
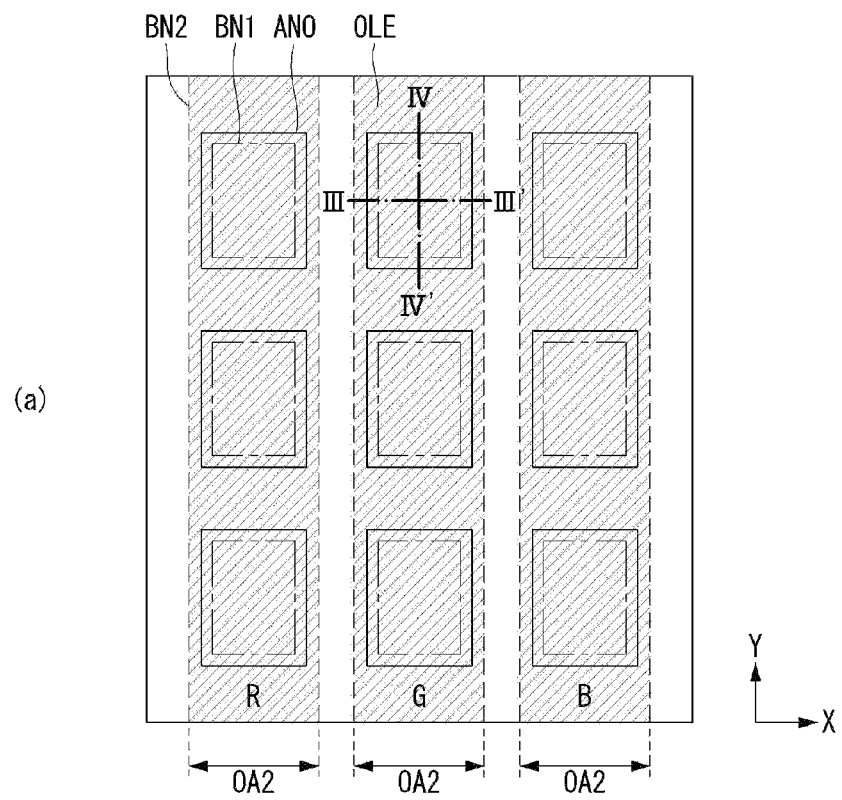
Figure 7:
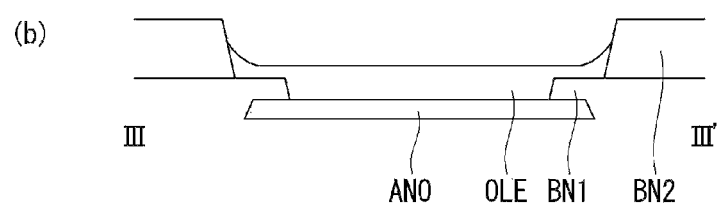
Figure 7:
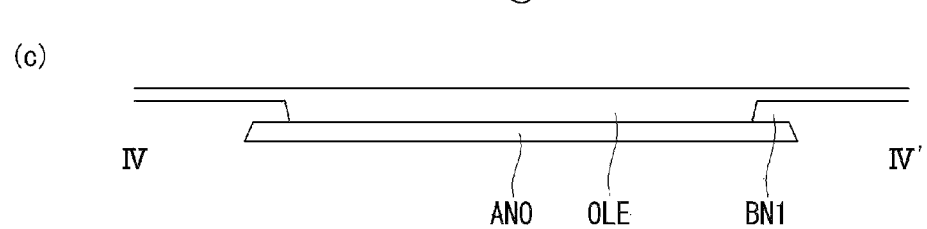

FIGS. 5 to 7 are time series diagrams showing how the first electrode, the first bank, the second bank, and the organic emission layer according to the first embodiment are formed. In FIGS. 5 to 7, (a) is a plane view schematically illustrating positions of a first electrode, a first bank, a second bank, and an organic emission layer, (b) is a cross-sectional view of (a) taken along line and (c) is a cross-sectional view of (a) taken along line IV-IV'. For convenience of explanation, procedures before forming an anode electrode will be omitted.

Referring to FIG. 5, pixel areas are defined as being arranged on a substrate in a matrix form in a first direction (for example, the Y-axis direction) and a second direction (for example, the X-axis direction). A first electrode ANO is formed in each pixel area. In the drawings, the first electrode ANO is depicted as having a rectangular shape, but aspects of the present invention are not limited thereto. In addition, all the first electrodes ANO are depicted as having the same shape and size, but aspects of the present invention are not limited thereto and at least one first electrode ANO may be different in shape or size from another first electrode ANO. For example, the shape or size of the first electrode ANO may be selected in consideration of the lifespan of an organic light emission material EM.

A first bank BN1 is formed on a substrate on which the first electrode ANO is formed. The first bank BN1 includes a first opening OA1 through which at least part of the first electrode ANO is exposed. Each first electrode ANO is exposed through its corresponding first opening OA1. Thus, the number of first openings OA1 corresponds to the number of first electrodes ANO.

Referring to FIG. 6, a second bank BN2 is formed on a substrate on which the first bank BN1 is formed. The second bank BN2 includes a second opening OA2 through which at least part of the first electrode ANO is exposed. The second opening OA2 extends in a first direction, so that a plurality of first electrodes ANO, and a plurality of first openings OA1 arranged in the first direction is exposed through the second opening OA2. A plurality of second openings OA2 are arranged side by side in a second direction, and extends in the first direction.

Referring to FIG. 7, an organic emission layer OLE is formed on the substrate on which the second bank BN2 is formed. Organic emission materials EM, which form the organic emission layer OLE, are coated inside the second opening OA2 in a direction in which the second opening OA2 extends. Accordingly, the organic emission materials EM covers a part of the first bank BN1 and a part of the first electrode ANO exposed through the second opening OA2. When viewed in plane, the organic emission layers OLE are arranged in a stripe pattern.

Organic emission materials EM of different colors may be coated alternatively and sequentially in each second opening OA2. The organic emission materials EM of different colors may include red (R), green (G), and blue (B) organic emission materials, and may further include white (W) organic emission materials (EM), when necessary.

Organic emission materials EM of the same color are coated on a plurality of first electrodes ANO exposed through one second opening OA2. It means that a plurality of pixel areas defined at a location corresponding to one second opening OA2 emits light of the same color. The second banks BN2 are disposed between first electrodes ANO neighboring in the second direction, so that organic emission materials EM of different colors in each second opening OA2 are not mixed.

Comparable Example

Figure 8:
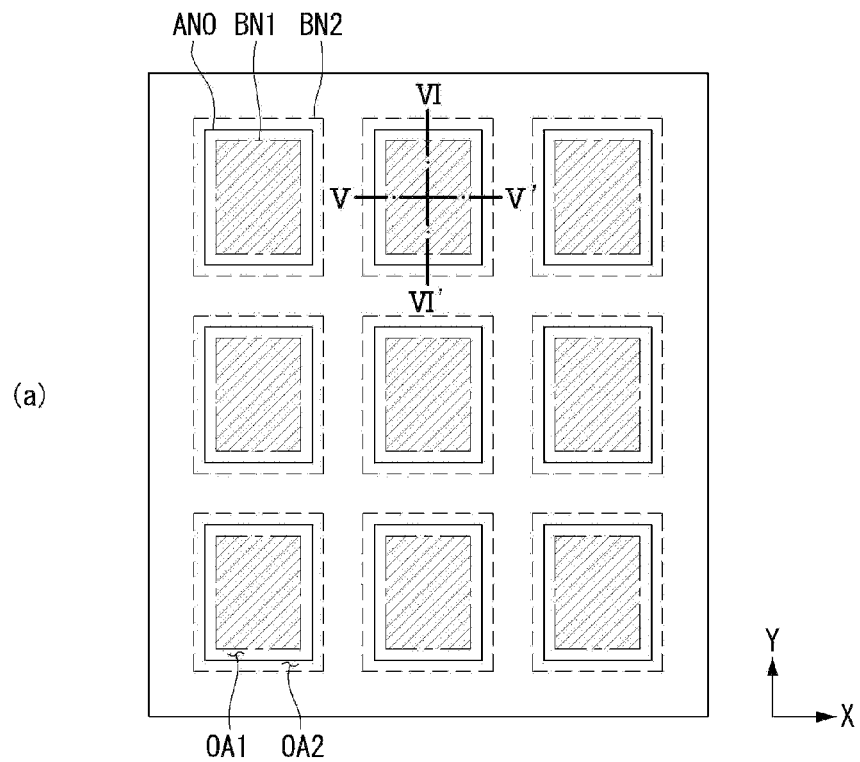
FIG. 8 is a diagram illustrating an organic light emitting diode display device according to a comparable example.
Figure 8:
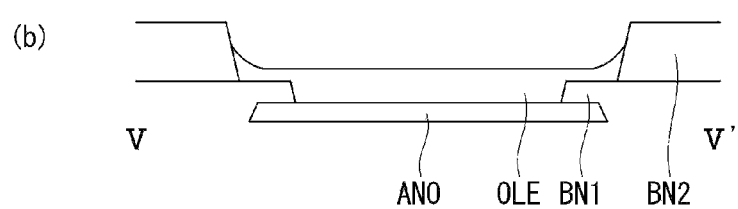
Figure 8:
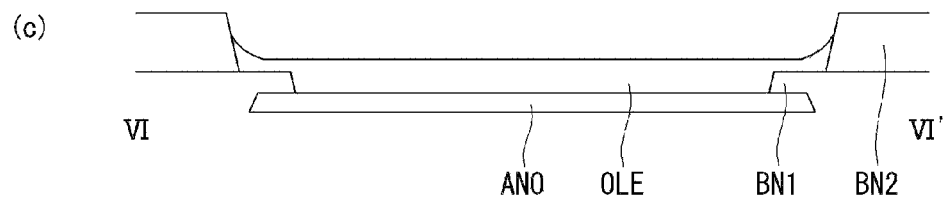

Hereinafter, there are described effects of the organic light emitting diode displaying device according to the first embodiment of the present invention with reference to FIGS. 8 and 9. FIG. 8 is a diagram illustrating an organic light emitting diode display device according to a comparable example.

Referring to FIG. 8, the organic light emitting diode display device according to the comparable example includes a substrate having pixel areas defined as being arranged in a matrix form in a first direction (for example, the Y-axis direction) and a second direction (for example, the X-axis direction). A first electrode ANO is formed in each pixel area.

A first bank BN1 is formed on a substrate on which the first electrode ANO is formed. The first bank BN1 includes a first opening OA1 through which at least part of the first electrode ANO is exposed. Each first electrode ANO is exposed through its corresponding first opening OA1. Thus, the number of first openings OA1 corresponds to the number of first electrodes ANO.

A second bank BN2 is formed on a substrate on which the first bank BN1 is formed. The second bank BN2 includes a second opening OA2 through which at least part of the first electrode ANO is exposed. Each first electrode ANO is exposed through its corresponding second opening OA2. Thus, the number of second openings OA2 corresponds to the number of first electrodes ANO. The second opening OA2 is spaced apart at a predetermined distance outwardly from the boundary of the first opening OA1. The second banks BN2 are disposed between first electrodes ANO neighboring in the first direction and between first electrodes ANO neighboring in the second direction.

An organic emission layer OLE is formed on the substrate on which the second banks BN2 are formed. Organic emission materials EM, which forms the organic emission layer OLE, are coated inside the second opening OA2. When viewed in plane, the organic emission layers OLE are disposed in a dot array pattern.

Figure 9:
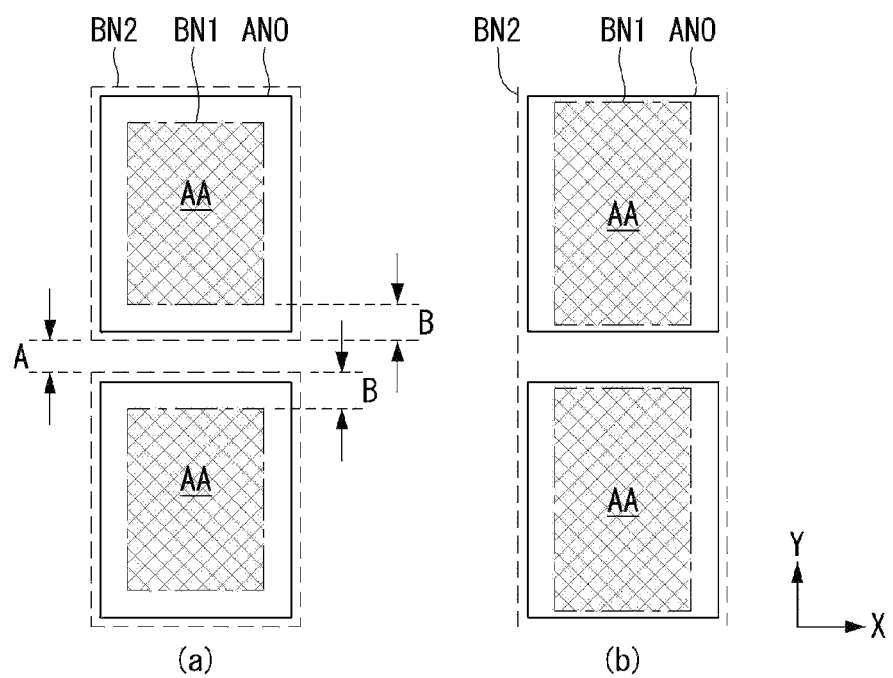
FIG. 9 is a diagram for comparison between the organic light emitting diode display device according to the first embodiment of the present invention and the organic light emitting diode display device according to the comparable example.

FIG. 9 is a diagram for comparison between the organic light emitting diode display device according to the first embodiment of the present invention and the organic light emitting diode display device according to the comparable example. In FIG. 9, (a) shows the structure of pixel areas neighboring in a first direction in the organic light emitting diode display device according to the comparable example, and (b) shows the structure of pixel areas neighboring in a first direction in the organic light emitting diode display device according to the first embodiment of the present invention.

The first bank BN1 has a hydrophilic property, and the second bank BN2 has a hydrophobic property. The hydrophilic property of the first bank BN1 and the hydrophobic property of the second bank BN2 are in a trade-off relationship. Thus, in order to secure uniformity of the organic emission layer, a first opening of the first bank BN1 and a second opening of the second bank BN2 need to be designed in consideration of the hydrophilic property and the hydrophobic property.

Specifically, the boundary of the first bank BN1 needs to be spaced apart at a predetermined distance B from the boundary of the second bank BN2. The predetermined distance B indicates a minimum distance between the boundary of the first bank BN1 and the boundary of the second bank BN2 to secure uniformity of the organic emission layer. For example, the predetermined distance B between the boundary of the first bank BN1 and the boundary of the second bank BN2 is preferably equal to or greater than 2.5 $\mu$m.

In the case where a distance between the boundary of the first bank BN1 and the boundary of the second bank BN2 is smaller than the predetermined distance B, it is not possible to secure uniformity of the emission area AA in the organic emission layer. In the case where a distance between the boundary of the first bank BN1 and the boundary of the second bank BN2 is greater than the predetermined distance B, a more area of the first electrode ANO may be shielded by the first bank BN1, thereby reducing an aperture ratio.

Referring to (a) of FIG. 9, a second bank BN2 having a predetermined width A is disposed between pixel areas neighboring in a first direction in the organic light emitting diode display device according to the comparable example. The boundary of the first bank BN1 is spaced apart at the predetermined distance B from the boundary of the second bank BN2, and thus, the first bank BN1 shields the edge of the first electrode ANO in the first direction, the edge which is almost as large as the predetermined distance B. In this case, since the area of the emission area AA is reduced as much as the shielded part of the first electrode ANO, it is not possible to secure a sufficient aperture ratio.

Referring to (b) of FIG. 9, the second opening of the second bank BN2 extends in the first direction in the organic light emitting diode display device according to the first embodiment of the present invention, and thus, the second bank BN2 is not disposed between pixel areas neighboring in the first direction. Accordingly, unlike the comparable example, the first embodiment of the present invention provides a structure in which there is no constraint on a position of the first bank BN1 in the first direction, so that a large emission area AA of the first electrode ANO may be secured. The first embodiment of the present invention may provide an organic light emitting diode display device with an aperture ratio that is sufficient as compared to the comparable example.

Second Embodiment

Figure 10:
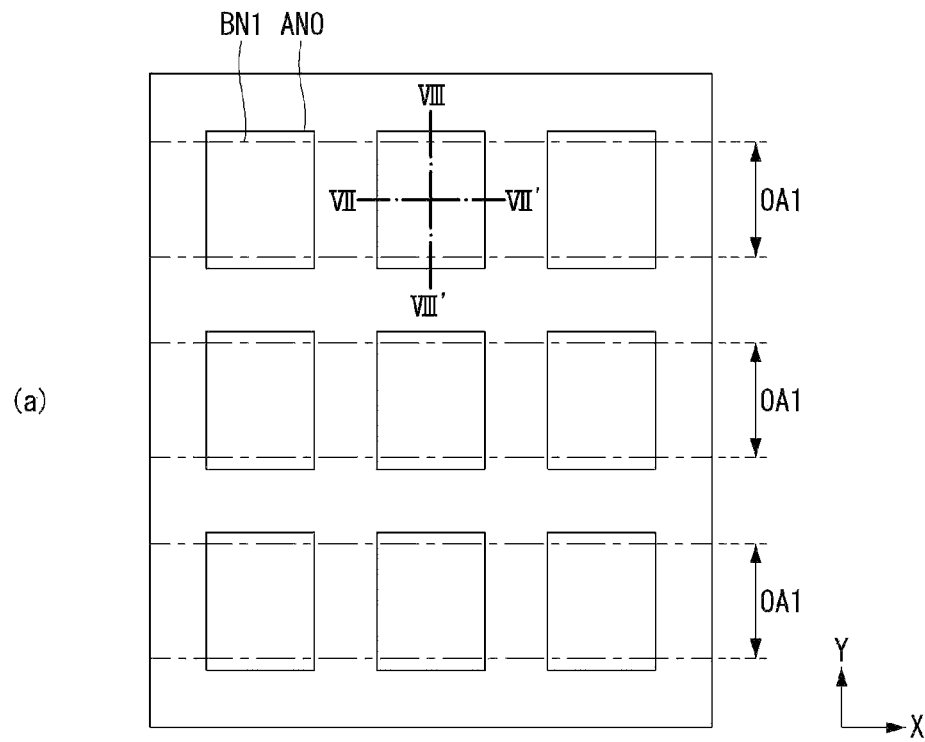
FIGS. 10 to 12 are time series diagrams showing how a first electrode, a first bank, a second bank, and an organic emission layer according to the second embodiment are formed.
Figure 10:
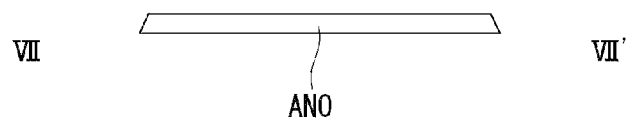
Figure 10:
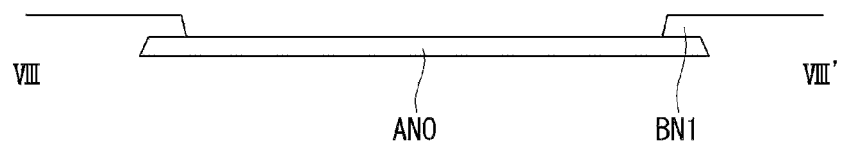
Figure 11:
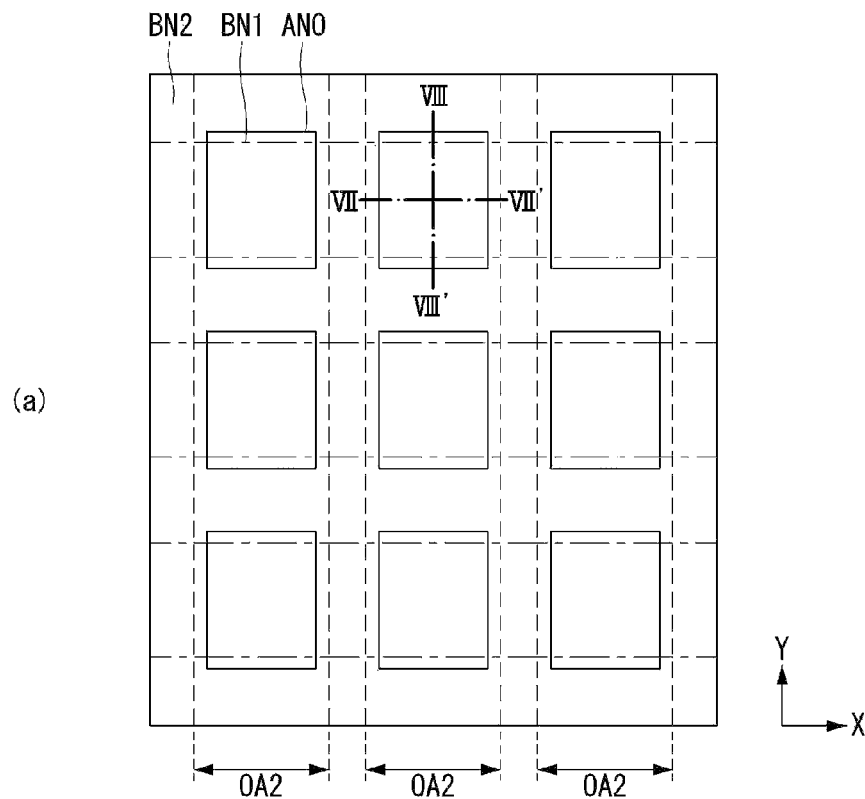
Figure 11:
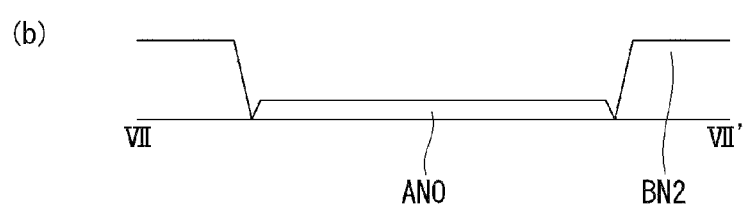
Figure 11:
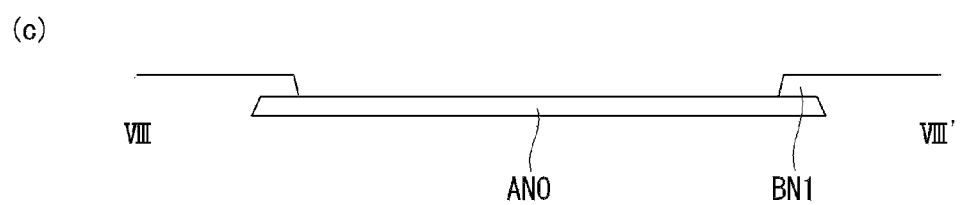
Figure 12:
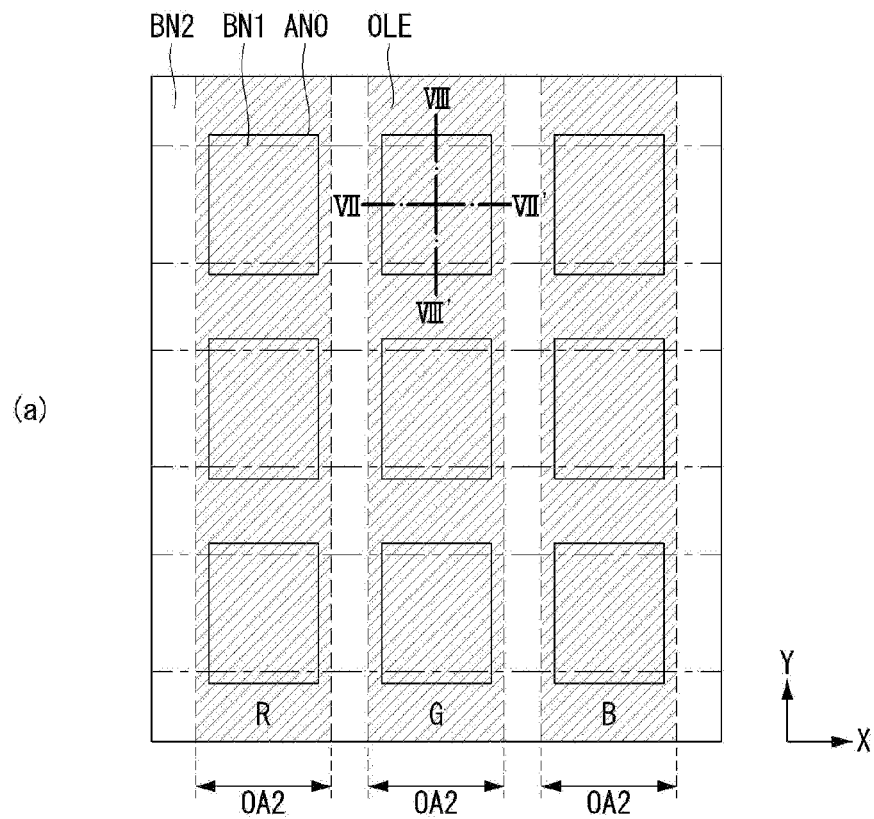
Figure 12:
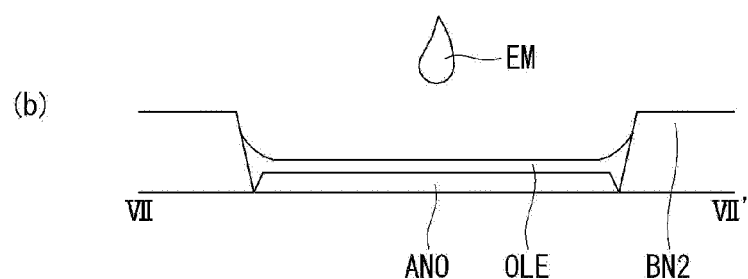
Figure 12:
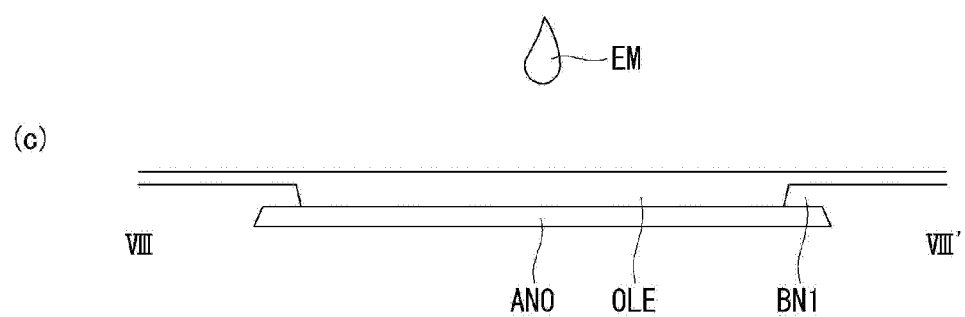

Hereinafter, there is described an organic light emitting diode display device according to a second embodiment of the present invention with reference to FIGS. 10 to 13. FIGS. 10 to 12 are time series diagrams showing how a first electrode, a first bank, a second bank, and an organic emission layer according to the second embodiment are formed. In FIGS. 10 to 12, (a) is a plane view schematically illustrating positions of the first electrode, the first bank, the second bank, and the organic emission layer, (b) is a cross-sectional view of (a) taken along line VII-VII', and (c) is a cross-sectional view (a) taken along line VIII-VIII'. Procedures before forming an anode electrode are omitted from the following description for convenience of explanation.

Referring to FIG. 10, pixel areas are defined as being arranged on a substrate in a matrix form in a first direction (for example, the Y-axis direction) and a second direction (for example, the X-axis direction). A first electrode ANO is formed in each pixel area. A first bank BN1 is formed on a substrate on which the first electrode ANO is formed. The first bank BN1 includes a first opening OA1 through which at least part of the first electrode ANO is exposed. The first opening OA1 extends in the second direction, so that a plurality of first electrodes ANO arranged in the second direction is exposed through the first opening OA1. A plurality of first openings OA1 is arranged side by side in the first direction, and extends in the second direction.

Referring to FIG. 11, a second bank BN2 is formed on a substrate on which the first bank BN1 is formed. The second bank BN2 includes a second opening OA2 through which at least part of the first electrode ANO is exposed. The second opening OA2 extends in the first direction, so that a plurality of first electrodes ANO arranged in the first direction is exposed through the second opening OA2. The second opening OA2 extends in the first direction to thereby intersect a plurality of first openings OA1 extending in the second direction. The plurality of second openings OA2 is arranged side by side in the second direction, and extends in the first direction. A first electrode ANO which is exposed through a first opening OA1 and a second opening OA2 intersecting each other may be defined as an emission area.

Referring to FIG. 12, an organic emission layer OLE is formed on a substrate on which a second bank BN2 is formed. Organic emission materials EM, which forms the organic emission layer OLE, are coated inside the second opening OA2 in a direction in which the second opening OA2 extends. Thus, the organic emission materials cover a part of first bank BN1 and a part of the first electrode ANO exposed through the second opening OA2. The first bank BN1 is a hydrophilic thin film provided to prevent poor wettability caused by the hydrophobic property of the first electrode ANO, and this film helps organic emission materials EM to spread out well. Thus, the organic light emitting diode display device according to the second embodiment has an advantage of reducing a pile-up phenomenon of a first direction. When viewed in plane, the organic emission layers OLE are arranged in a stripe pattern.

A plurality of first electrodes ANO exposed through a single second opening OA2 is coated with organic emission materials EM of the same color. It means that light of the same color is emitted from a plurality of pixel areas defined at a location corresponding to the single second opening OA2. The second bank BN2 is disposed between first electrodes ANO neighboring in the second direction, so that organic emission materials EM of different color arranged in each second opening OA2 are not mixed. To this end, the second bank BN2 may be formed with a thickness thicker than that of the first bank BN1.

Figure 13:
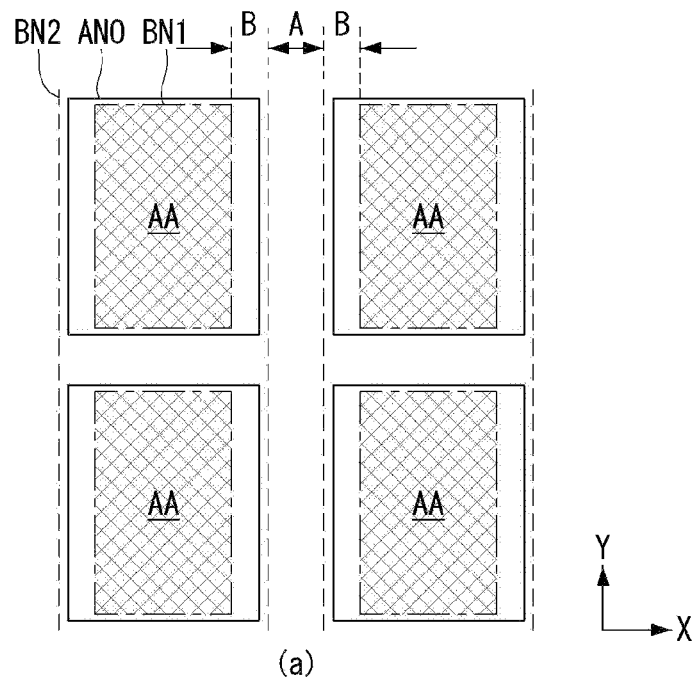
FIG. 13 is a diagram for comparison between the organic light emitting diode display device according to the first embodiment and the organic light emitting diode display device according to the second embodiment.
Figure 13:
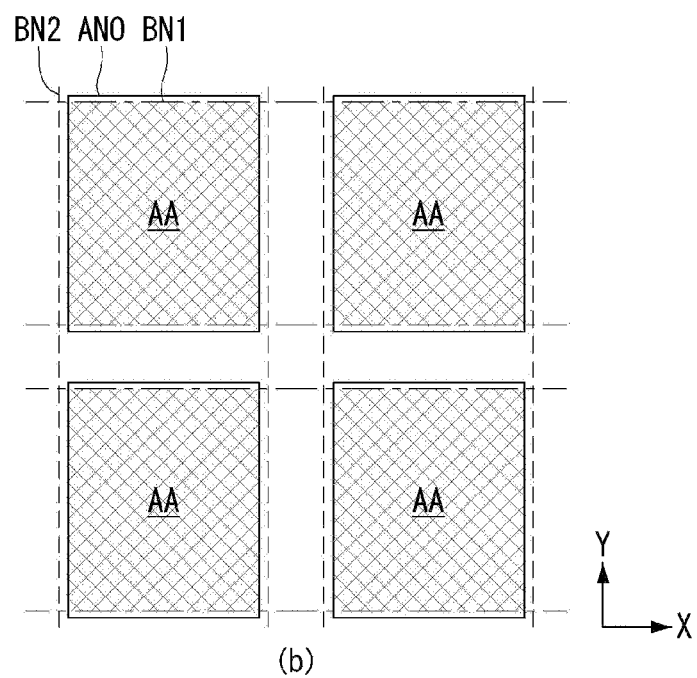

Hereinafter, there are described effects of the organic light emitting diode display device according to the second embodiment of the present invention with reference to FIG. 13. FIG. 13 is a diagram for comparison between the organic light emitting diode display device according to the first embodiment and the organic light emitting diode display device according to the second embodiment. In FIG. 13, (a) shows the structure of pixel areas neighboring in the first direction and the second direction in the organic light emitting diode display device according to the first embodiment, and (b) shows the structure of pixel areas neighboring in the first direction and the second direction in the organic light emitting diode display device according to the second embodiment.

The first bank BN1 has a hydrophilic property, and the second bank BN2 has a hydrophobic property. The hydrophilic property of the first bank BN1 and the hydrophobic property of the second bank BN2 are in a trade-off relationship. Thus, in order to secure uniformity of the organic emission layer, a first opening of the first bank BN1 and a second opening of the second bank BN2 need to be designed in consideration of the hydrophilic property and the hydrophobic property.

Specifically, the boundary of the first bank BN1 needs to be spaced apart at a predetermined distance B from the boundary of the second bank BN2. The predetermined distance B indicates a minimum distance between the boundary of the first bank BN1 and the boundary of the second bank BN2 to secure uniformity of the organic emission layer. For example, the predetermined distance B between the boundary of the first bank BN1 and the boundary of the second bank BN2 is preferably equal to or greater than 2.5 μm.

In the case where a distance between the boundary of the first bank BN1 and the boundary of the second bank BN2 is smaller than the predetermined distance B, it is not possible to secure uniformity of an emission area AA in the light emitting layer. In addition, in the case where a distance between the boundary of the first bank BN1 and the boundary of the second bank BN2 is greater than the predetermined distance B, a more area of the first electrode ANO may be shielded by the first bank BN1, thereby reducing an aperture ratio.

Referring to (a) of FIG. 13, a second bank BN2 having a predetermined width A is disposed between pixel areas neighboring in the second direction in the organic light emitting diode display device according to the first embodiment. At this point, the boundary of the first bank BN1 is spaced apart from the boundary of the boundary of the second bank BN2, and therefore, the first bank BN1 shields the edge of the first electrode ANO in the second direction, the edge which is almost as large as the predetermined distance B. In this case, the area of the emission area AA is reduced as much as the shielded part of the first electrode ANO.

Referring to (b) of FIG. 13, a first bank BN1 is not disposed between pixel areas neighboring in the second direction in the organic light emitting diode display device according to the second embodiment of the present invention because a first opening of the first bank BN1 extends in the second direction. Accordingly, unlike the first embodiment, the second embodiment provides a structure in which there is no constraint on a position of the first bank BN1 in the second direction, and therefore, it is possible to secure a large emission area AA of the first electrode ANO. The second embodiment of the present invention may provide an organic light emitting diode display device having an aperture ratio that is sufficient as compared to the first embodiment.

The above description are about an example of a rear emission-type (or bottom emission-type) organic light emitting diode display device, but aspects of the present invention are not limited thereto and embodiments of the present invention may be implemented as a front emission-type (or top emission-type) organic light emitting diode display device.

Figure 14:
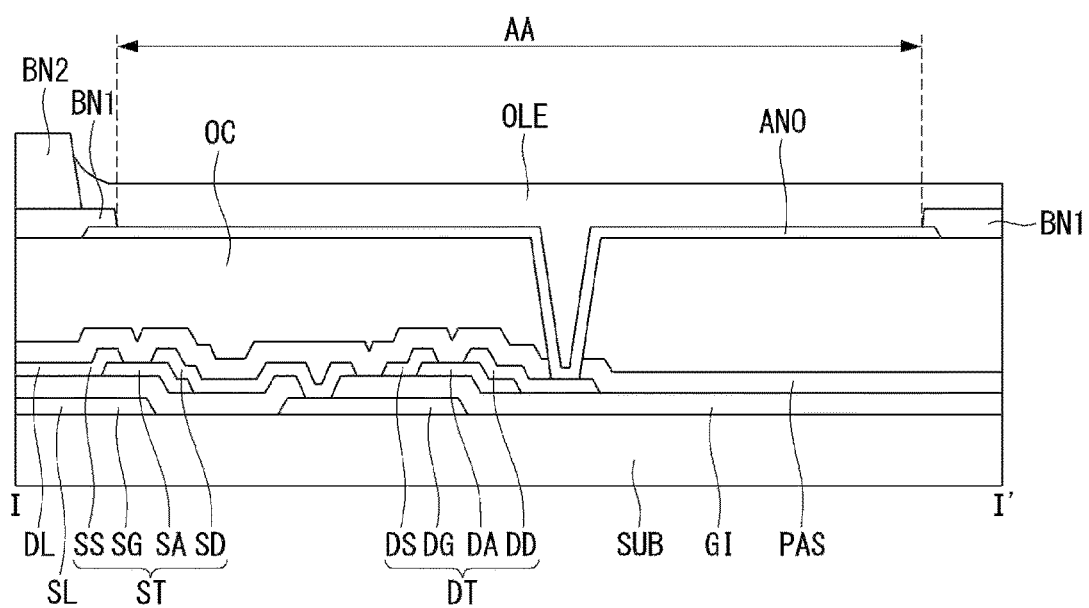
FIG. 14 is a schematic diagram of a front emission-type organic light emitting diode display device.

For example, referring to FIG. 14, a front emission-type organic light emitting diode display device emits light from an organic emission layer OLE toward a surface, not toward a rear surface in which a substrate SUB is disposed, and thus, a large emission area AA may be secured no matter where TFTs ST and DT and various lines SL, DI, and VDL are positioned. That is, the front emission-type structure is configured such that the first electrode ANO extends widely even on various lines SL, DL, and VDL, and therefore, it is possible to increase an aperture ratio as compared to the rear emission-type structure shown in FIG. 3.

It will be apparent to those skilled in the art that various modifications and variations can be made in the organic light emitting diode display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode display device, comprising:
    a substrate including pixel areas defined in a matrix form in first and second directions intersecting each other, each pixel including a corresponding driving transistor;
    a plurality of first electrodes, each arranged in the corresponding pixel areas;
    a first bank having at least one first opening over at least part of the first electrode;
    a second bank covering a part of the first bank and including at least one second opening over at least part of the first electrode; and
    an organic emission layer disposed in the first opening,
    wherein the second opening extends in the first direction so that the plurality of first electrodes arranged in the first direction are under the second opening, and
    wherein the organic emission layer extends over an entire corresponding driving transistor.

2. The organic light emitting diode display device of claim 1, wherein:
    the first bank includes a hydrophilic material; and
    the second bank includes a hydrophobic material.

3. The organic light emitting diode display device of claim 1, wherein the first opening is over the corresponding one of the plurality of first electrodes.

4. The organic light emitting diode display device of claim 3, wherein a boundary of the second opening is spaced apart at a predetermined distance outwardly from a boundary of the first opening.

5. The organic light emitting diode display device of claim 1, wherein the first opening extends in the second direction, so that the plurality of first electrodes arranged in the second direction are under the first opening.

6. The organic light emitting diode display device of claim 5, wherein the first opening and the second opening intersect each other.

7. The organic light emitting diode display device of claim 1, wherein a plurality of organic emission layers that are disposed on the plurality of first electrodes under one second opening have the same color.

8. The organic light emitting diode display device of claim 1, further comprising:
    a plurality of second openings; and
    a plurality of organic emission layers,
    wherein the plurality of second openings are arranged side by side in the second direction,
    wherein the plurality of organic emission layers have a first color, a second color, and a third color that are different from each other, and
    wherein the organic emission layers of the first, second, and third colors are disposed alternatively and sequentially in the plurality of second openings.

9. The organic light emitting diode display device of claim 1, wherein a thickness of the second bank is thicker than a thickness of the first bank.

10. The organic light emitting diode display device of claim 1, wherein one of the first electrodes has a shape or size different from a shape or size of another.

11. The organic light emitting diode display device of claim 1, wherein the boundary of the first opening is situated inside the boundary of the first electrode.

12. The organic light emitting diode display device of claim 1, wherein the second bank does not cover the first bank in the pixel areas.

13. An organic light emitting diode display device including a plurality of pixels arranged in a matrix form in first and second directions intersecting each other, comprising:
    a first bank patterned in units of one pixel to define an emission area in each of the plurality of pixels, each pixel including a corresponding driving transistor; and
    a second bank disposed on the first bank and extending in a first direction between neighboring pixels in a second direction to be arranged in a stripe pattern, the second bank being configured to expose each emission area,
    wherein each emission area extends over an entire corresponding driving transistor.

14. The organic light emitting diode display device of claim 13, wherein:
    each of the plurality of pixels includes an organic light emitting diode; and
    the emission area is deposed on the first electrode of the organic light emitting diode.

15. The organic light emitting diode display device of claim 13, wherein:
    the first bank includes a hydrophilic material; and
    the second bank includes a hydrophobic material.

16. An organic light emitting diode display device including a plurality of pixels arranged in a matrix form in first and second directions intersecting each other, comprising:
    a plurality of first electrodes, each arranged in the corresponding pixel areas;
    a first bank on the first electrode, extending in a second direction, and disposed only between neighboring pixels in a first direction in a stripe pattern; and
    a second bank on the first bank, extending in the first direction, and disposed only between neighboring pixels in the second direction in a stripe pattern,
    wherein the first bank and the second bank intersect each other to define an emission area in each of the plurality of pixels, and
    wherein the emission area is at least part of the first electrode that is opened without being shielded by the first bank and the second bank.

17. The organic light emitting diode display device of claim 16, wherein:
    each of the plurality of pixels includes an organic light emitting diode; and
    the emission area is on the first electrode of the organic light emitting diode.

18. The organic light emitting diode display device of claim 16, wherein:
    the first bank includes a hydrophilic material; and
    the second bank includes a hydrophobic material.

19. The organic light emitting diode display device of claim 16, wherein a thickness of the second bank is thicker than a thickness of the first bank.

20. The organic light emitting diode display device of claim 17, wherein each pixel comprises:
- a corresponding driving transistor; and
- an organic emission layer of the organic light emitting diode on the first electrode,
- wherein the organic emission layer extends over an entire corresponding driving transistor.

\* \* \* \* \*